United States Patent [19]

Goldwasser et al.

[11] Patent Number: 4,908,866
[45] Date of Patent: Mar. 13, 1990

[54] SPEECH TRANSCRIBING SYSTEM

[76] Inventors: Eric Goldwasser; Dorothy Goldwasser, both of 993 Barberry Rd., Yorktown Heights, N.Y. 10598

[21] Appl. No.: 697,965

[22] Filed: Feb. 4, 1985

[51] Int. Cl.⁴ .......................... G10L 7/08; G10L 3/02
[52] U.S. Cl. ...................................... 381/44; 369/25; 369/50; 381/30
[58] Field of Search ................. 381/31, 44, 51, 30, 381/34, 35; 365/45; 369/25-29, 50, 60; 364/513.5; 360/7

[56] References Cited

U.S. PATENT DOCUMENTS

| | | | |
|---|---|---|---|
| 3,576,406 | 4/1971 | Dugny et al. | 360/7 |
| 3,614,336 | 10/1971 | Patey | 369/50 |
| 3,645,539 | 2/1972 | Jenkins | 360/7 |
| 3,646,576 | 2/1972 | Griggs | 381/44 |
| 3,798,372 | 3/1974 | Griggs | 381/35 |
| 3,855,424 | 12/1974 | Tharmaratman et al. | 381/35 |
| 3,869,576 | 3/1975 | Griggs | 381/44 |
| 4,071,716 | 1/1978 | Bretschneider et al. | 381/34 |
| 4,093,831 | 6/1978 | Sharp et al. | 369/25 |
| 4,318,188 | 3/1982 | Hoffmann | 365/45 |
| 4,348,754 | 9/1982 | Haynes et al. | 369/60 |
| 4,366,471 | 12/1982 | Kasuga | 381/34 |
| 4,389,541 | 3/1983 | Nakano et al. | 381/51 |
| 4,408,309 | 10/1983 | Kiesling et al. | 360/7 |
| 4,488,274 | 12/1984 | Plunkett | 369/24 |
| 4,568,912 | 2/1986 | Kitamura et al. | 381/31 |
| 4,581,759 | 4/1986 | Takahashi | 369/60 |
| 4,623,988 | 11/1986 | Paulson et al. | 369/29 |
| 4,627,001 | 12/1986 | Stapleford et al. | 364/513.5 |

Primary Examiner—Gary V. Harkcom
Assistant Examiner—David D. Knepper
Attorney, Agent, or Firm—Pennie & Edmonds

[57] ABSTRACT

A speech transcription apparatus comprising a first transducer for converting speech from a first individual to an electrical signal, a memory device for storing the electrical signal, and a second transducer for reproducing the speech in response to the stored electrical signal. The memory device is arranged for simultaneous recording and playback, so that a second individual can transcribe stored speech substantially simultaneously with storage of further speech. A variable delay period between the storing of the speech and its reproduction is provided. The delay period may be controlled by the second individual. The device enables substantially real-time transcription of spoken speech. Periods of silence in the first individual speech are deleted, without intrference with the reproduction function. The memory may be configured as a magnetic tape unit or as a random access memory unit.

8 Claims, 3 Drawing Sheets

SPEECH TRANSCRIBING SYSTEM

BACKGROUND OF THE INVENTION

The present invention relates to a method and apparatus which facilitate the transcription of spoken words into text. More particularly, the invention relates to a speech transcribing and text processing system having the feature of allowing the playback of previously stored speech while continuing to record new speech.

Dictation machines that record speech on magnetic media are well known. Typically, such machines have features such as pause and cue review to help the transcriber adjust the speed of playback of the speech to his or her typing speed.

In the broadcast industry, speech recording and playback machines are used to delay live broadcasts, typically by seven seconds to permit deletion of inappropriate spoken words. With such machines, it is possible to interrupt the playback of speech; however, the period of time delay (7 seconds) always remains the same.

Although the equipment of the type described above serves well the purpose for which it is intended, such machines are not readily adaptable to the "live" transcription of speech; that is, the transcription of spoken words into a text processing system by a typist at essentially the same time that these words are dictated.

SUMMARY OF THE INVENTION

A principal object of the present invention is to provide a system (method and apparatus) for facilitating the transcription of spoken words into text, by a first person (typist) essentially simultaneously with the dictation of these words by a second person.

Another object of the present invention is to permit a typist to vary the rate at which speech is received, and/or to interrupt the receipt of speech, during the "live" transcription of words spoken by a person giving dictation.

A further object of the present invention is to provide a speed transcribing system which permits the visual display of transcribed text at the position of the person giving dictation.

A further object of the present invention is to provide means which facilitate the correction of transcribed text by a typist at the request of a person giving dictation.

These objects, as well as further objects which will become apparent in the discussion that follows, are achieved, according to the present invention, by storing dictated speech in a buffer memory; retrieving this speech from this memory with a prescribed time delay with respect to the time that the speech is stored; interrupting the storage of speech in the memory during periods of silence, thereby reducing the time delay; and selectively changing the time delay between storing the speech in, and retrieving the speech from the memory, so as to control the time that the speech is heard by the typist.

BRIEF DESCRIPTION OF THE DRAWINGS

FIG. 5 is a software flow diagram for the computer implementation of FIG. 4.

DESCRIPTION OF THE PREFERRED EMBODIMENTS

The preferred embodiments of the present invention will now be described with reference to FIGS. 1-4 of the drawings.

Figure 1:
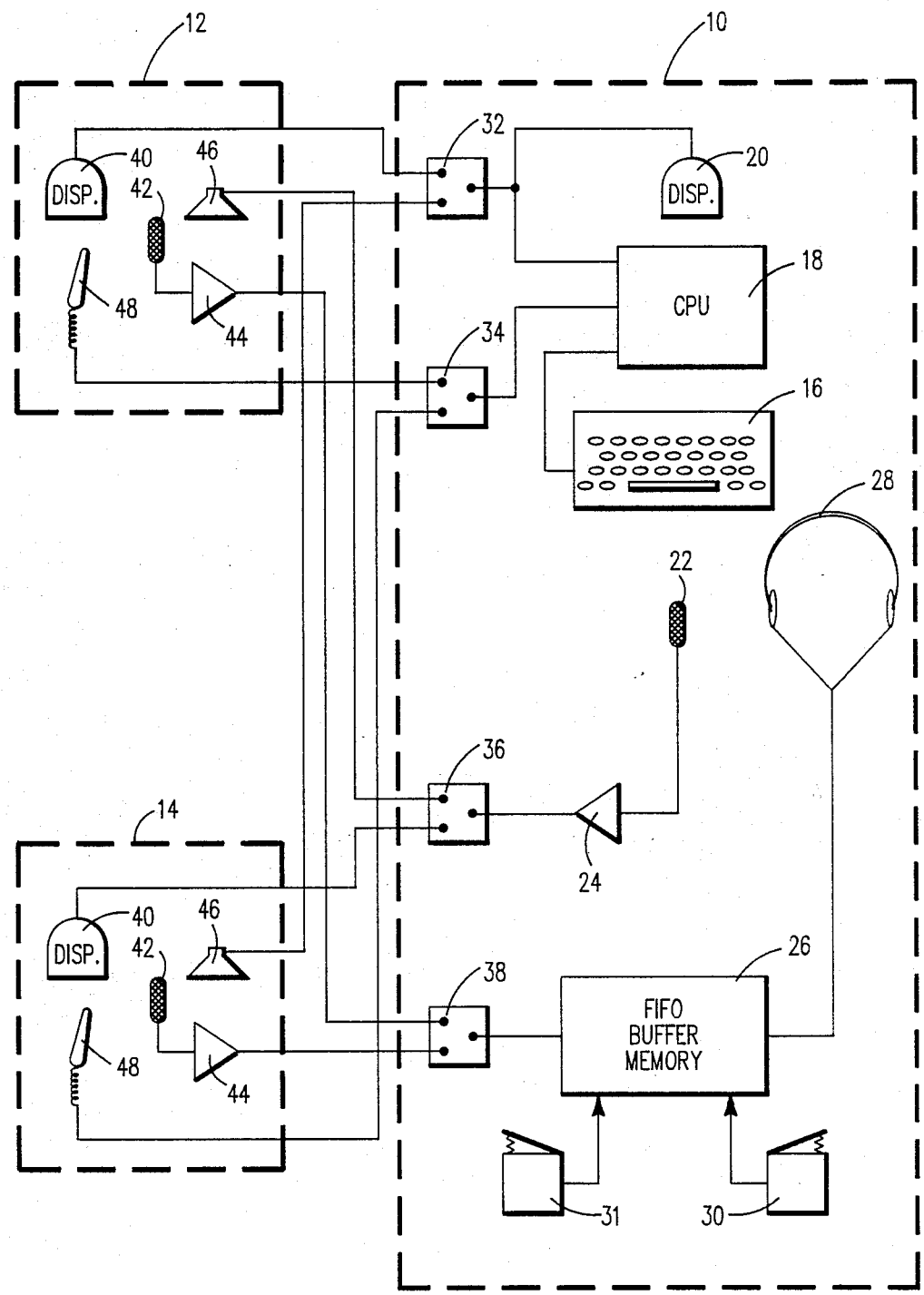
FIG. 1 is block diagram of a speech transcribing system according to a preferred embodiment of the present invention and incorporating a first-in, first-out buffer memory.

FIG. 1 shows the speech transcribing system according to the present invention. This system comprises a principal transcribing work station 10 and two selectively connectable dictating stations 12 and 14. The system can be expanded at will to include additional, identical dictating stations.

The transcribing work station includes a conventional text entry system comprising a keyboard 16, a central processing unit 18 (with memory) and a display device 20 such as a cathode ray tube display. The text entry system may, for example, comprise a personal computer which is suitably programmed with word processing software. It should be emphasized that the text entry system 16, 18 and 20 may be completely conventional, although one embodiment of the present invention, which will be described hereinbelow, requires modification of the word processing software.

In addition to the text entry system, the speech transcribing work station 10 includes a microphone 22 with an associated amplifier 24 which permits a person operating the work station to talk to a person, at a remote location, who is dictating the text.

Furthermore, the work station 10 comprises a first-in, first-out ("FIFO") buffer memory 26 for the dictated text and earphones (electrical energy to sound transducers) 28. The buffer memory 26, which will be described in detail hereinbelow, is provided with foot actuated devices 30 and 31 for controlling the rate and time at which speech is read out of the buffer memory.

Finally, the transcribing work station 10 includes four switches 32, 34, 36 and 38 allowing the operator to select one of the various dictating stations 12 and 14.

Each dictating station 12, 14, comprises a display device 40, identical or analogous to the display device 20 of the work station 10; a microphone 42 and an associated audio amplifier 44; a loudspeaker 46; and a light pen 48 which operates in conjunction with the display device 40 to select a point on the display. Some other pointing mechanism such as a "mouse" or a touch sensitive screen, may be substituted for or provided in addition to the light pen 48.

As may be seen in FIG. 1, the four elements of the dictating station (display 40, light pen 48, loudspeaker 46 and microphone 42) may be selected by respective ones of the switches 32, 34, 36 and 38. These switches may be mechanically connected together so that a single knob operates the four switches together, or each switch may be provided with its own control knob so that it may be actuated independently.

In operation, the speech transcribing system of FIG. 1 permits a person at station 12 or 14 to dictate words into microphone 42 and to see these words cancatenated into text on the display 40 substantially as soon as they are dictated. The typist, who operates the transcribing station 10 is able to communicate with the person at station 12, for example to inquire about text format and/or misunderstood words, via the microphone 22 and loudspeaker 46. The person dictating may correct the text by verbal instructions conveyed through the microphone 42 and by pointing to words or letters on the screen with the light pen 48.

The typist at the work station 10 provides essentially a "live" transcription of the dictated words heard over the earphones 28. This transcription is facilitated by the FIFO buffer memory 26. When the person dictating into the microphone 42 at the station 12 or 14 first starts to speak, the effective length of the buffer is very short. This means that each segment of speech is stored in the buffer and immediately played out so that there is no apparent time delay in transmission through the buffer. The typist who is transcribing the speech can therefore type the words as if he or she were hearing them directly from the speakers mouth. Since typists cannot normally keep up with dictation, the typist will probably soon fall behind the speaker. The typist may then change the time delay through the buffer from zero to some number of seconds. This is accomplished by changing the effective length of the buffer with the aid of the control devices 30 and/or 31. In this case, speech that was recorded several seconds previously is played out while new speech is simultaneously being recorded. The typist can then continue to type several seconds behind the speaker. If the typist should fall further behind, he or she can make the delay through the buffer even longer. If necessary, the typist can also replay portions of the speech stored in the buffer while the buffer continues to store new speech.

The buffer memory operates to store only spoken words, rather than silence. Consequently, when the speaker pauses, the effective length of the buffer decreases, decreasing the time delay from recording to playback, and the typist "catches up" with the speaker.

Figure 2:
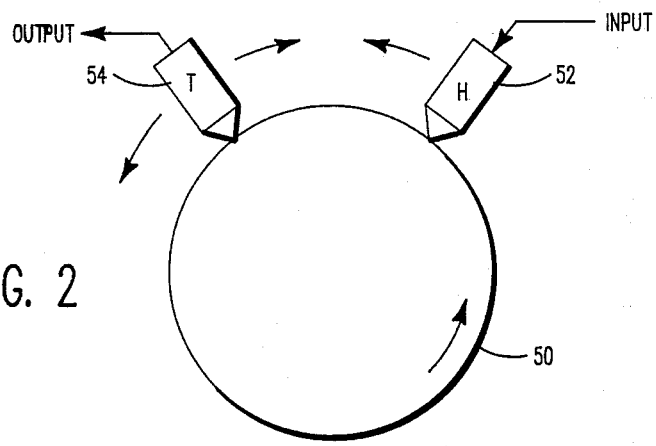
FIG. 2 is a representational diagram illustrating the operation of the buffer memory in FIG. 1.

The principle of operation of the FIFO buffer memory is shown in FIG. 2. In this diagram, the circle 50 represents a recirculating memory, which may be visualized as a continuously rotating loop of magnetic tape. Recording and playback heads 52 and 54, respectively, define the "head" and "tail" of the recorded speech. At the start of dictation, these two heads will be close together so that the delay time in the buffer memory is short. If the typist begins to fall behind, however, he or she is able to move the playback head 54 toward the left, away from the recording head 52 so as to interrupt the playback or to replay previously played speech. The recording head 52 will remain stationary while speech is being recorded. During periods of silence, however, it will rotate counter clockwise in a fixed position relative to the magnetic tape 50 so that silence will not be recorded on the tape 50. The recording head 52 will thus move toward the playback head 54, reducing the time delay between recording and playback.

Although an electromechanical tape recording system of the type represented in FIG. 2 may be used in an implementation of the FIFO buffer memory, it is possible also to implement this buffer using only conventional solid state electronic components. Such an embodiment is illustrated in FIG. 3.

Figure 3:
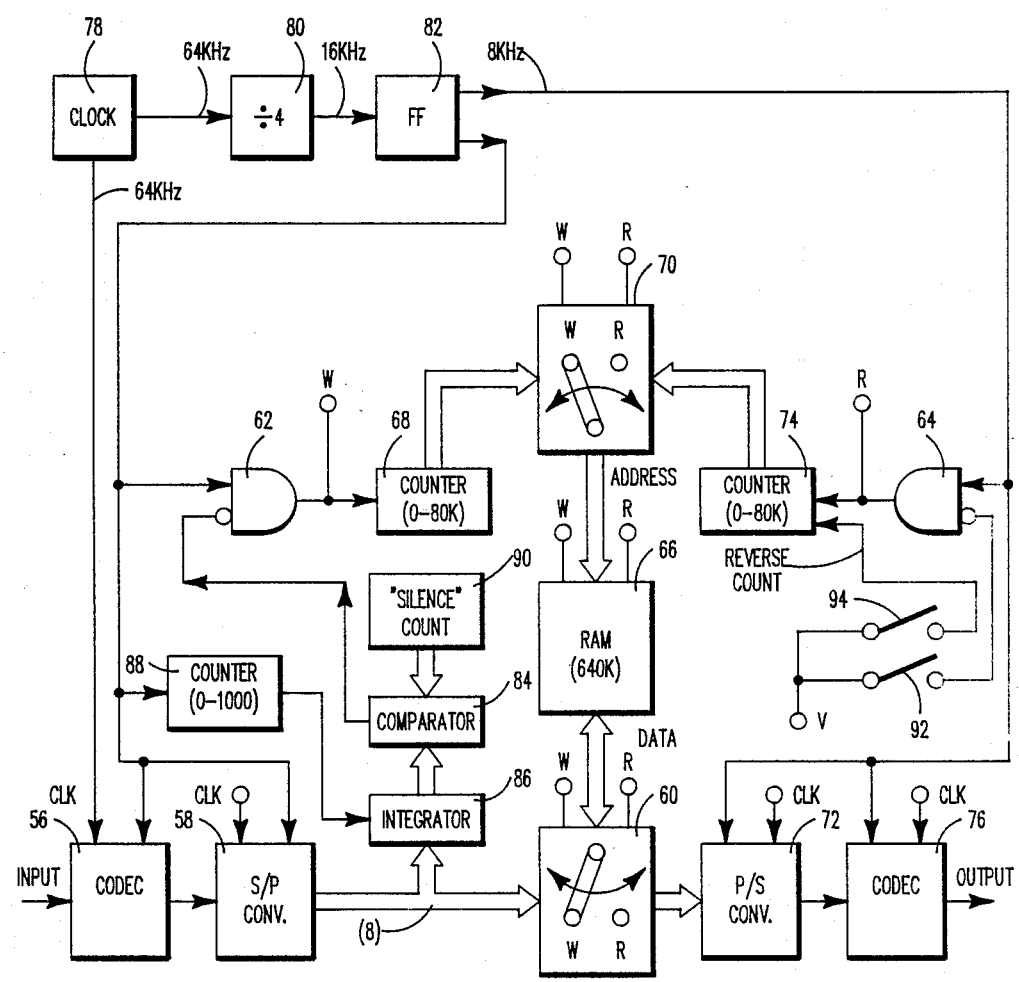
FIG. 3 is a block diagram of a dedicated hardware implementation of the buffer memory of FIG. 1.

In the embodiment shown in FIG. 3, the analog voice signal is applied to a PCM codec 56 which samples the input signal 8000 times per second and produces an 8-bit byte in response to each sample. The byte is supplied in a serial PCM bit stream at a rate of 64 kilobits per second to a serial-to-parallel converter 58. The converter 58 generates parallel bytes at a rate of 8000 per second and passes these to a read/write switch 60. The read/write switch 60 is alternately set into the write position "W" and read position "R" by digital pulses generated by AND gates 62 and 64, respectively. When set in the "W" position, the read/write switch passes a byte from the S/P converter 58 to a random access memory (RAM) 66. This byte is read into this RAM at the address generated by a 0–80K counter 68 and supplied through a second read/write switch 70. The read/write switch 70, which handles the address, is operated in synchronism with the read/write switch 60, which handles the data for the RAM 66.

Alternately between write cycles, data is read out of the RAM 66 via the read/write switch 60 and passed to a parallel/serial converter 72. The address of the data read out of the RAM is generated by a 0–80K counter 74 and supplied to the RAM via the read/write switch 70. The P/S converter 72 passes a serial PCM bit stream to a second codec 76 which converts this input back into an analog voice signal.

The FIFO buffer memory of FIG. 3 is operated by a 64 KHz clock 78 which produces the basic clock signal CLK that drives the codecs 56 and 76 and the two converters 58 and 72. The 64 KHz clock signal is also divided down by a divider 80 into a 16 KHz signal which is applied to a flip flop 82. The flip flop produces two oppositely poled 8 KHz square wave signals that are applied to the AND gates 62 and 64, respectively. If these AND gates are not blocked by signals at the inhibit inputs, they produce the "W" and "R" pulses, respectively.

A string of zero or near-zero bytes representing silence in the input signal result in the application of an inhibit signal to the AND gate 62. This signal is generated by a comparator 84 which continuously compares the accumulated count of the last thousand bytes (received during the last ⅛ of a second) to a low threshold count which represents silence. The accumulated count is generated by an integrator 86 that repeatedly adds the most recently received byte to, and subtracts the byte received ⅛ of a second previously from, the accumulated 1000 byte count. The silence count is generated by dip switches 88.

Control of the addresses from which PCM bytes are read out of the memory 66 is effected by switches 90 and 92. Switch 90, when closed, applies a voltage to the inhibit input of AND gate 64 preventing the advantage of counter 74 and generation of a read pule "R". The readout of data from the RAM 66 is consequently interrupted. Switch 92, when closed, causes the counter 74 to count backwards in response to pulses from the AND gate 64, so as to drop back to an earlier address and permit the re-reading of bytes from the RAM 66.

The FIFO buffer memory of FIG. 3 is provided with 640K bits of RAM which is sufficient to store digital signals representing 10 seconds of voice (at the 64KB/sec. rate). A 5 second voice stream could, therefore, be stored in only 320K bits (or 40K bytes) of memory so that it is clearly possible to use the memory of the computer 18 (FIG. 1) to store this data.

Figure 4:
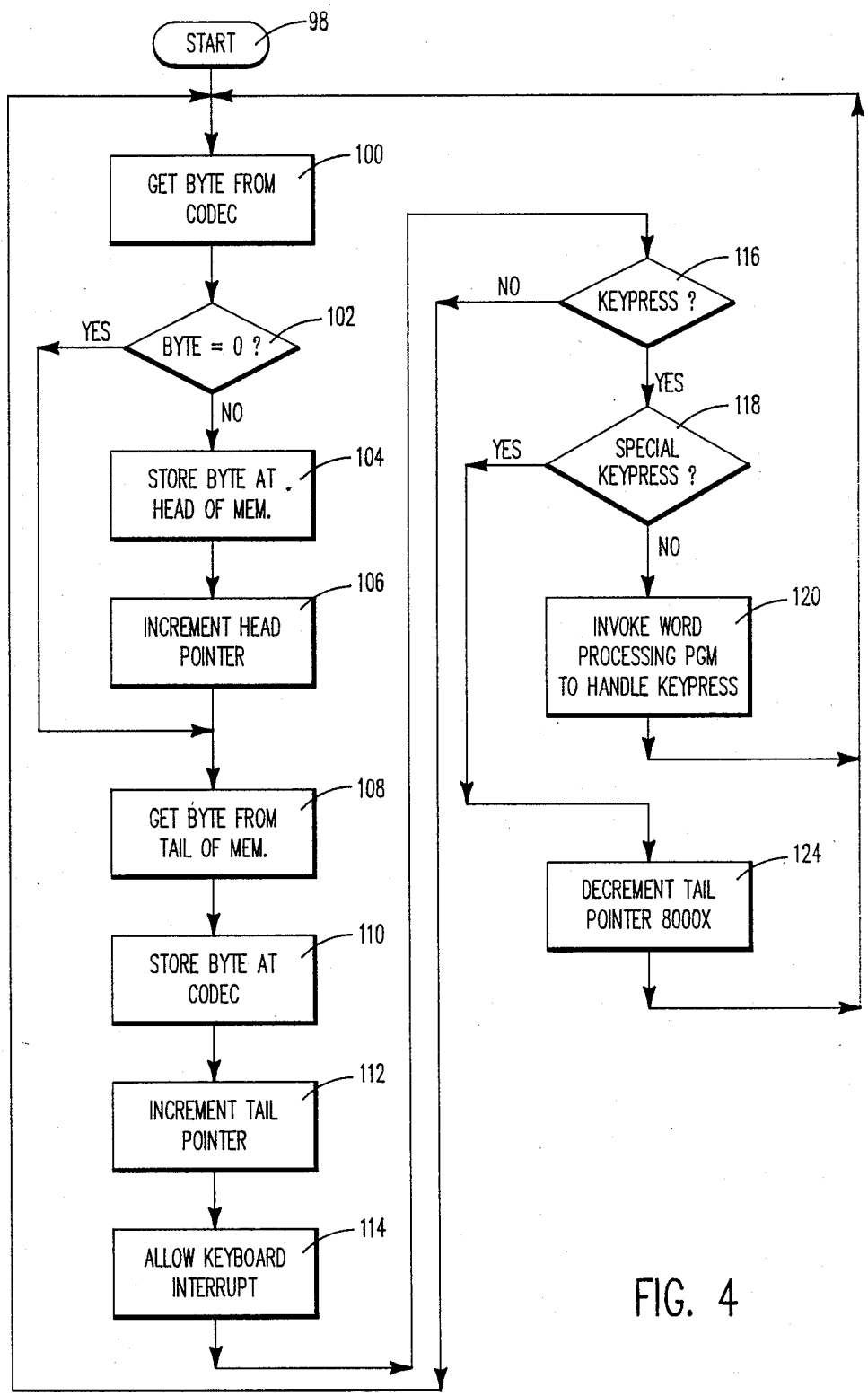
FIG. 4 is a block diagram of a general purpose computer implementation of the buffer memory of FIG. 1.

FIG. 4 illustrates an alternative embodiment which utilizes the capability of an IBM Personal Computer 18 to form a FIFO buffer memory. Connected to this computer 18 is a PC MATE ™ LAB TENDER Laboratory Instrumentation Interface Unit available from Tecmar, Inc. Personal Computer Division, 23600 Mercantile Road, Cleveland, Ohio 44122. This "LAB TENDER" is constructed as a circuit board which may be inserted into one of the expansion slots of the IBM PC.

The LAB TENDER 93 makes available, as one of its features, analog input and output ports connected to an A-to-D converter 94 and D-to-A converter 95, respectively. These A-to-D and D-to-A converters supply bytes to, and receive bytes from, a data buffer 96 which is connected via bus lines 97 to a parallel I/O channel of the IBM PC 18. The timing of the entire system is controlled by a timer 98.

FIG. 5 shows a flow chart for a computer algorithm which may be run on the IBM PC 18 of FIG. 4 to implement the functions of the FIFO buffer memory.

When the system is started, the algorithm is entered at block 99 and a byte, which originated from the A-to-D converter 94, is fetched from the data buffer 96 (block 100). A test is then performed to determine whether the byte is associated with silence (block 102). If the byte is not associated with silence, then at block 104 the byte is stored in the computer memory which consists of a consecutive series of addresses and is organized as a "circular memory". That is, when the addresses of the consecutive series reach the end of the series, the address pointer is automatically adjusted to the beginning of the series again.

Data is stored in the computer memory at an address designated by a "head pointer"; data is retrieved from the computer memory at an address designated by a "tail pointer". After storing a byte, in block 104, the head pointer is incremented by one at block 106.

At block 108, the byte in the position pointed to by the tail pointer is fetched. If the byte looked at in the decision block 102 is associated with silence, the block 108 is executed immediately after block 102. At block 110, the byte fetched from the tail of the memory is sent to the data buffer 96 for transmission to the D-to-A converter 95. The converter 95 outputs the corresponding analog signal to an amplifier and then to the earphones 28 of the typist. Then at block 112, the tail pointer is increased by one byte.

At block 114, the interrupt mask of the computer is changed briefly to allow an interrupt from the keyboard. At block 116 the keyboard buffer is checked to see if a key was depressed. If not, then block 100 is re-entered to fetch another byte from the data buffer. If the keyboard buffer does contain a keypress, then this keypress is examined at block 118 to determine if it is a "special keypress" intended to change the playback delay in the FIFO buffer memory. If it is not such a keypress, then a word processing routine is envoked at block 120 to handle the keypress so that the appropriate modification is made to the text buffer and the displays 20 and 40 of the speech transcribing system are updated.

If the keypress is a "special keypress" intended to change the delay, then the tail pointer is decremented by the appropriate number of bytes at block 124. Finally, after execution of the tasks in block 120 or block 124, the block 100 is re-entered to fetch another byte from the codec.

There has thus been shown and described a novel speech transcribing system which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are intended to be covered by the claims which follow.

What is claimed is:

1. In combination, apparatus for the convenient transcription of speech, said apparatus comprising:
    a first transducer for generating an electrical signal in response to speech consisting of words or groups of words spoken by a first individual and intervening periods of silence;
    means for continuously storing said electrical signal and for simultaneously reproducing a continuous segment of signal having been stored previously;
    means for disabling said means for storing and reproducing from storing said signal during said periods of silence, whereby only signal responsive to said spoken words is stored;
    a second transducer connected to said means for storing and reproducing said signal, for reproducing said words, so as to be audible by a second individual;
    means for controlling said means for storing and reproducing, such that said means for storing and reproducing is controlled to store signal corresponding to words spoken by said first individual and simultaneously provide previously stored signal to said second transducer for reproducing words previously spoken to said second individual, and wherein the signal being reproduced at any given time corresponding to the previously stored signal is delayed with respect to the time at which the corresponding signal was stored by a variable delay period;
    means operable by said second individual for providing a delay control signal to said means for controlling said means for storing and reproducing; and
    a first video display device;
    a keyboard device for accepting keystroke inputs from the second individual, and for displaying text corresponding thereto on said first display device, and for accepting further keystroke inputs from the second individual for editing said displayed text; and
    a second video display device for displaying the edited text to the first individual;
    wherein said means for controlling said means for storing and reproducing varies the delay period responsive to said delay control signal.

2. The apparatus of claim 1, in further combination with signal generating means for being moved by said first individual to generate a signal for causing a visible indication to be displayed on said first and second video display devices, whereby the attention of the second individual can be drawn to a particular portion of the text by said first individual.

3. The apparatus of claim 1, further comprising switch means controllable by said second individual, whereby said means for storing is enabled to store electrical signals received from one of a plurality of first transducers.

4. The apparatus of claim 1 wherein said means for storing and reproducing is a magnetic tape storage unit, comprising means for driving a magnetic tape past first recording and second reproducing transducing heads, and wherein the spacing of said heads is varied in response to said delay control signal to vary said delay period.

5. The apparatus of claim 4 wherein the spacing of said heads is also varied in order that periods of silence occurring while said tape is being operated to allow said second individual to transcribe words corresponding to signals stored thereon are not recorded.

6. The apparatus of claim 1 wherein said means for storing comprises analog-to-digital converter means and a random-access memory.

7. The apparatus of claim 6 in combination with means for addressing said random access memory at a first location to store data corresponding to said electrical signal, means for addressing said random-access memory at a second location to retrieve data corresponding to said stored signal, digital to analog converter means for reproducing said signal, and means responsive to said delay control signal for defining said first and second locations.

8. The apparatus of claim 1, wherein said delay period is continuously variable responsive to the said delay control signal.

* * * * *